United States Patent
Hellig et al.

(10) Patent No.: US 6,673,635 B1
(45) Date of Patent: Jan. 6, 2004

(54) METHOD FOR ALIGNMENT MARK FORMATION FOR A SHALLOW TRENCH ISOLATION PROCESS

(75) Inventors: Kay Hellig, Dresden (DE); Douglas J. Bonser, Austin, TX (US); Srikanteswara Dakshina-Murthy, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/185,780

(22) Filed: Jun. 28, 2002

(51) Int. Cl.[7] .............................................. H01L 21/00
(52) U.S. Cl. .................. 438/7; 438/8; 438/311; 438/424; 438/445; 438/734
(58) Field of Search ................ 438/734, 7, 8, 438/311, 318, 400, 401, 404, 424, 427, 444, 445, 446

(56) References Cited

U.S. PATENT DOCUMENTS

| | | | | |
|---|---|---|---|---|
| 5,633,190 A | * | 5/1997 | Sugiyama | 438/404 |
| 5,830,797 A | * | 11/1998 | Cleeves | 438/296 |
| 5,963,816 A | * | 10/1999 | Wang et al. | 438/401 |
| 6,001,696 A | * | 12/1999 | Kim et al. | 438/296 |
| 6,037,236 A | * | 3/2000 | Jang | 438/401 |
| 6,043,133 A | * | 3/2000 | Jang et al. | 438/401 |
| 6,207,530 B1 | * | 3/2001 | Hsu et al. | 438/404 |
| 6,281,539 B1 | * | 8/2001 | Mandelman et al. | 257/302 |
| 2003/0008472 A1 | * | 1/2003 | Yoshimura et al. | 438/400 |

FOREIGN PATENT DOCUMENTS

WO    WO 01/67509 A1  *  9/2001 ........... H01L/21/70

* cited by examiner

*Primary Examiner*—Matthew Smith
*Assistant Examiner*—Renzo N. Rocchegiani
(74) *Attorney, Agent, or Firm*—Toler, Larson & Abel, LLP (57) ABSTRACT

Methods are presented for fabrication of alignment features of a desired depth, and shallow trench isolation (STI) features in Silicon-On-Insulator (SOI) material. Specific embodiments require no more than two lithography and etch processes, which represents an improvement over current methodology requiring three lithography and etch processes in order to produce the desired features during manufacture of a semiconductor device.

14 Claims, 8 Drawing Sheets

METHOD FOR ALIGNMENT MARK FORMATION FOR A SHALLOW TRENCH ISOLATION PROCESS

FIELD OF THE DISCLOSURE

The present invention relates generally to a semiconductor manufacturing process, and more particularly to a method for formation of alignment features on a device.

BACKGROUND

During the manufacture of semiconductor devices, wafers undergo multiple photolithography steps. After an initial lithography operation, the wafers must be properly aligned in subsequent lithography operations such that the pattern exposed into the photoresist from previous lithography operations aligns properly. To accomplish this, most lithography tools utilize special alignment marks to align all subsequently patterned layers. These alignment marks are patterned by an exposure, without alignment, followed by an etch process, which transfers the resist pattern into the wafer silicon substrate. The alignment marks in the substrate must have an optimal depth, dependant upon the manufacturer of the pattern alignment system, to provide best quality contrast for the pattern alignment system. For example, step and scan alignment systems manufactured by ASML have an optimum depth of about 120 nm, while systems manufactured by others, e.g., Canon, Nikon, etc., have a different optimum depth.

Silicon-on-insulator (SOI) wafers are made of a composite structure consisting of an active layer of silicon deposited on insulating materials. The insulator, or dielectric, can be sapphire, silicon dioxide, silicon nitride, or other insulating form of silicon. Composition of a SOI wafer prior to processing typically consists of a stack of a thin upper silicon layer on top of a buried oxide (BOX) layer, which is above the support substrate silicon. Depending upon the device requirements, the thickness of the upper silicon layer may vary between 5 nm and 200 nm or more.

When the SOI upper layer is significantly thicker, e.g., 200 nm, than the desired alignment mark depth, e.g., 120 nm, the alignment marks can be formed in the upper silicon layer in a fashion similar to bulk wafer technology. If the SOI upper layer thickness is about the same as the desired (optimal) alignment mark depth, e.g., 100 nm, the alignment marks can be formed together with the trench isolation feature patterns. This situation has an advantage over bulk processing as the formation of the alignment marks and trenches occurs with a single lithography step and etch step, and is typically used in the manufacture of partially depleted SOI technology, as presented with reference to prior art FIGS. 1 through 3.

Figure 1:
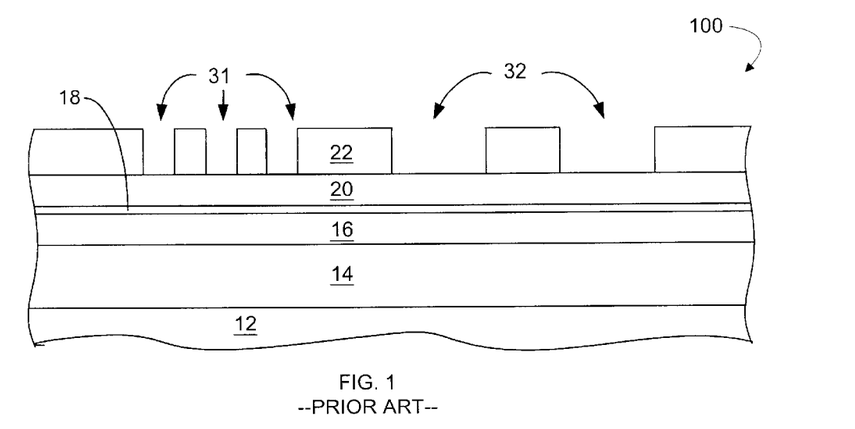
FIGS. 1–8 illustrate, in cross-section, semiconductor device manufacturing process steps according to the prior art.

FIG. 1 illustrates a cross-sectional view of a portion of an SOI wafer 100 after pad oxide layer 18 growth, nitride layer 20 deposition, and photoresist masking 22 to form trench isolation feature opening locations 31 and alignment feature opening location 32. The other constituents of portion of SOI wafer 100 are SOI substrate silicon 12, a buried oxide layer (BOX) 14, and an SOI upper layer 16. Mask 22 serves to define the opening locations 31 and 32 for the trench isolation features and the alignment feature respectively by protecting the underlying portions during the etch process which follows, discussed with reference to FIG. 2.

Figure 2:
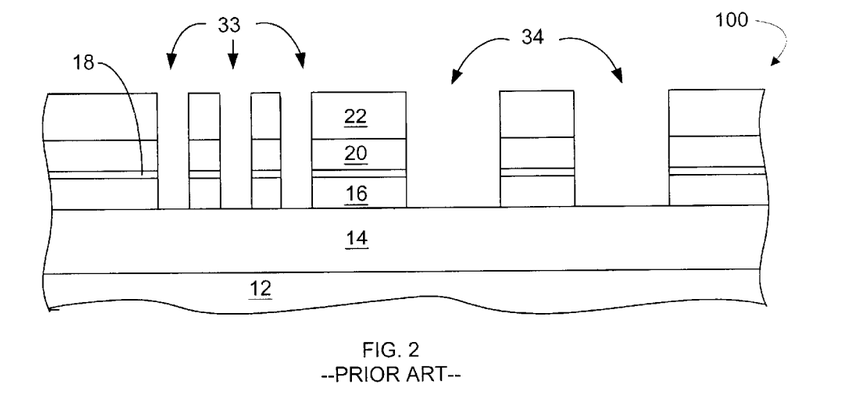

FIG. 2 illustrates a cross-sectional view of SOI wafer portion 100 after an etch process to form the openings 33, i.e., trench isolation feature opening 33, and the opening 34, i.e., alignment feature opening 34. The trench isolation feature may be a shallow trench isolation (STI) feature. Photoresist mask 22 will be removed in subsequent processing steps. Because the thickness of SOI upper layer 16 is about the same as the desired (optimal) alignment mark depth, the alignment features 34 can be formed together with the trench isolation features 33 in a single etch step.

Figure 3:
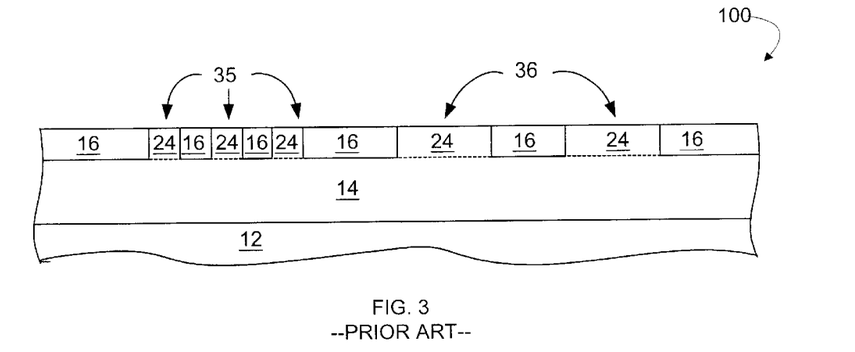

FIG. 3 illustrates portion of SOI wafer 100 after fill of openings 33 and 34 with a dielectric 24, such as silicon oxide, followed by planarization and removal of nitride and pad oxide layers. Alignment features 36 and trench features 35 have been patterned from upper SOI layer 16 in a single etch process. Planarization is typically accomplished by CMP (chemical mechanical polishing). SOI wafer portion 100 is ready for further fabrication processes toward device completion.

When the SOI upper layer thickness is significantly thinner than the desired alignment mark, as is typically the case in fully depleted SOI technology, it is impossible to use alignment marks in the upper SOI layer as was seen in FIGS. 1–3. This is because the marks would have insufficient contrast for the pattern alignment process. In this case, the alignment marks are formed in the bottom, support substrate silicon layer. To accomplish this, three separate lithography steps are required, as demonstrated with reference to prior art FIGS. 4 through 8.

Figure 4:
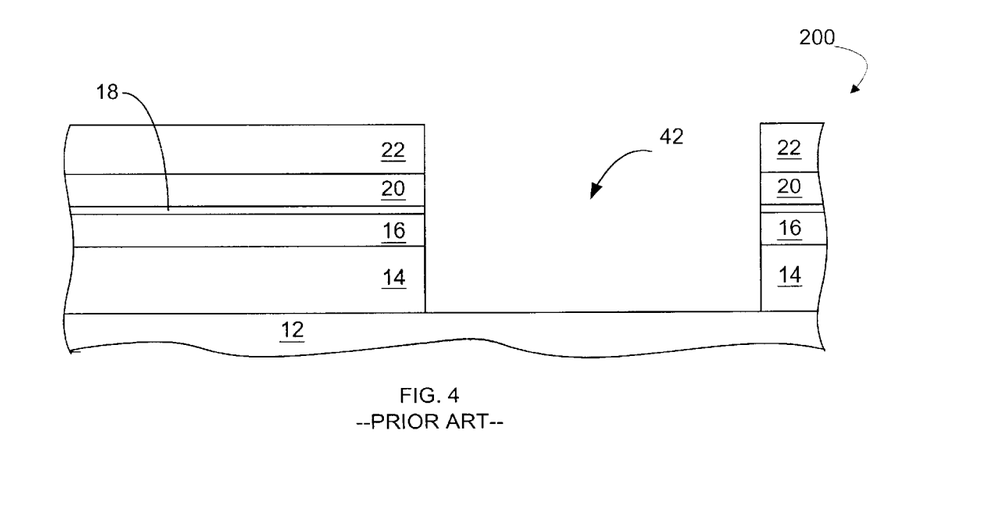

FIG. 4 illustrates a cross-sectional view of a portion of an SOI wafer 200 after pad oxide layer 18 growth, nitride layer 20 deposition, and a first etch process wherein photoresist mask 22 serves to define an opening location 42 to define later placement of alignment features. Other constituents of portion of SOI wafer 200 are SOI substrate silicon 12, a buried oxide (BOX) layer 14, and an SOI upper layer 16. As before, mask 22 serves to protect the portions underlying mask 22 during the etching process. Opening location 42 is etched to the depth of the uppermost surface of the substrate 12, in preparation for the second photolithography process.

Figure 5:
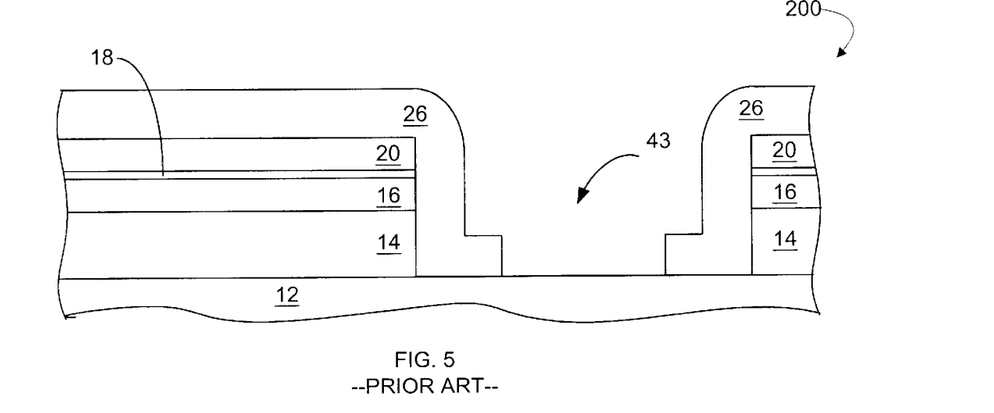
Figure 7:
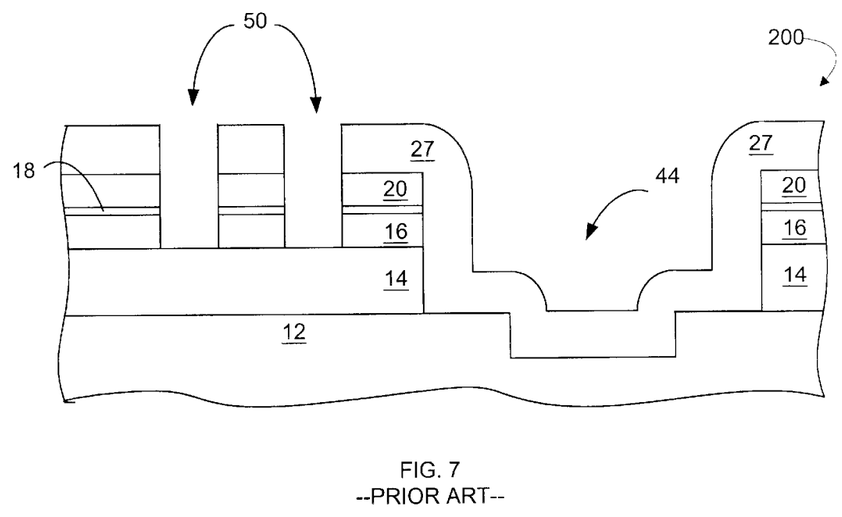

FIG. 5 illustrates the portion of wafer 200 after removal of the first resist layer and application of second resist mask 26. Second resist mask 26 serves to define an opening location 43 for subsequent etching into substrate 12. That is, photoresist mask 26 will be used to image the alignment features where the opening location (window) 42 was previously etched. In an embodiment, portions of layer 16 and 14, which remain after etching, will eventually serve as side walls for openings 50 (FIG. 7). Openings 50 shall serve as shallow trench isolation (STI) features in subsequent processing steps.

Figure 6:
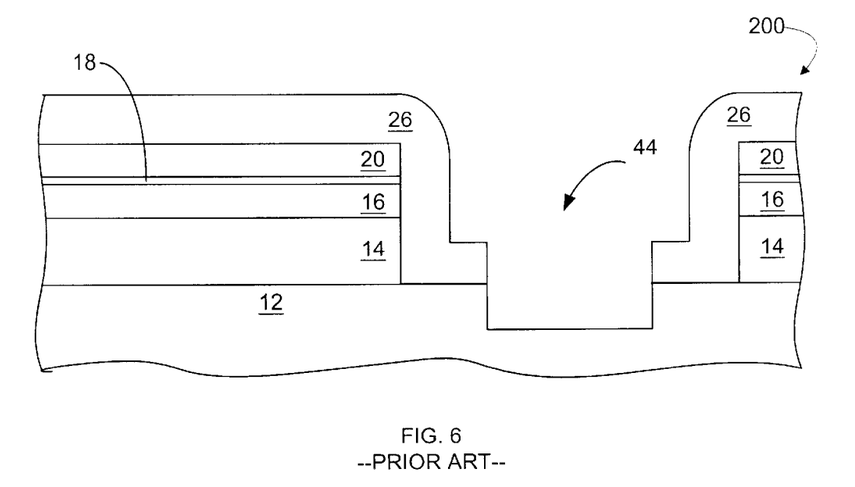

FIG. 6 illustrates a cross-sectional view of a portion 200 of an SOI wafer after etching into substrate 12. After completion of etch into substrate 12 to the desired depth, photoresist mask 26 is removed, in preparation for another lithography step and etch process.

FIG. 7 illustrates the portion 200 of SOI wafer after application of a STI pattern photoresist mask 27, and an etch process to form trench isolation feature openings 50, which serve to define shallow trench isolation features. This process uses the opening location 44 created in the previous etch process of FIG. 6 to properly align the STI mask 27. Mask 27 protects the formed location (alignment features) 44 during the etching process.

Figure 8:
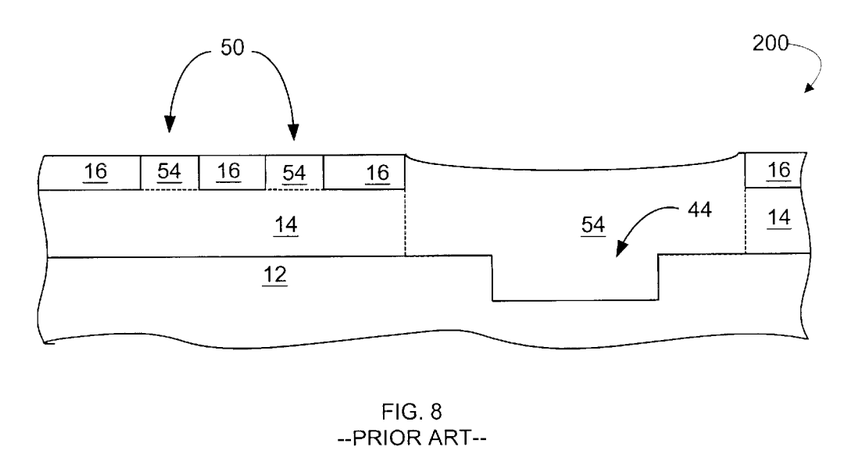

FIG. 8 illustrates the portion 200 of SOI wafer after fill of openings 50 and 44 with a dielectric, such as silicon oxide, followed by planarization and removal of nitride and pad oxide layers. Silicon oxide layer 54 has been patterned into upper SOI layer 16, while alignment features of the desired depth in formed opening 44 are patterned into substrate 12. As before, planarization of portion 200 is typically accomplished by CMP (chemical mechanical polishing). After planarization, SOI wafer portion 200 is subjected to further fabrication processes toward device completion.

To reach the point illustrated in FIG. 8 has required three lithography and etch processes, as discussed with reference to FIGS. 4 through 8. Thus the case where a thin SOI upper layer is used requires considerably more manufacturing capacity and cycle time than processing of SOI with a medium SOI top layer thickness, where only one lithography and etch step were needed. The thin SOI upper layer case also requires more manufacturing capacity and cycle time than the case of thick top layer of bulk material, in which only one lithography and etch steps are needed. However, in terms of device performance, it is desirable to use very thin SOI top layers, as thin SOI top layers enable formation of fully depleted SOI devices, e.g., devices that have lower leakage currents.

Therefore, what is needed is a method for forming alignment marks with the desired depth and STI features in thin upper SOI layers more efficiently than the current methodologies.

DETAILED DESCRIPTION OF THE FIGURES

FIGS. 9–15 illustrate, in cross-section, methods for fabrication of alignment features of a desired depth, and shallow trench isolation (STI) features in Silicon-On-Insulator Insulator (SOI) material. Specific embodiments of the present disclosure require no more than two lithography and etch processes, which represents an improvement over current methodology requiring three lithography and etch processes in order to produce the desired features during manufacture of a semiconductor device.

In various embodiments, a first photoresist mask is formed over a substrate to define a first opening location. This opening location, when it is subsequently formed, will serve as the window in which alignment features shall be created in a separate (second) masking and etching step. The second photoresist masking of the substrate is used to define a second opening location for a trench isolation region, as well as a third opening location for an alignment feature. That is, the third opening location is within the first opening defined by the first photoresist masking and etching processes. The trench isolation features and alignment features are formed by use of anisotropic dry etch processes known in the art. In an embodiment, the trench isolation features are shallow trench isolation (STI) features. In various embodiments, the etch processes may be monitored during etching.

The descriptions in FIGS. 9 through 15 reference the methodology with regard to silicon SOI wafers. It will be appreciated, however, that the methodology as disclosed herein can also apply to Semiconductor-On-Insulator wafers made from different materials, e.g., GaAs-on-Si, SiGe-on-Si, and other materials with slight modifications, e.g., oxide deposition instead of thermal oxidation.

Figure 9:
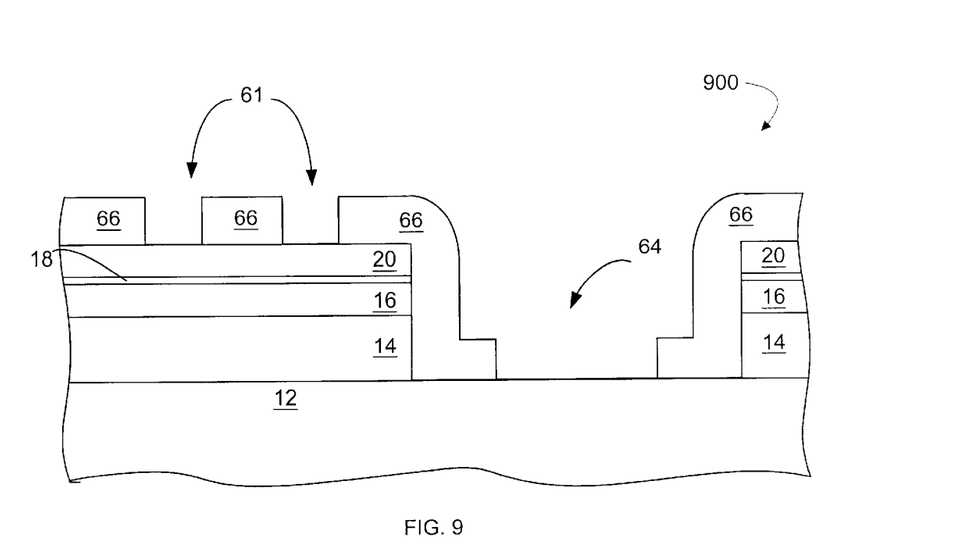
FIGS. 9–15 illustrate, in cross-section, semiconductor device manufacturing process steps according to at least one embodiment of the present disclosure.

In FIG. 9, a cross-sectional view of a portion 900 of a semiconductor wafer at a point in the device manufacturing cycle is shown. On the support substrate 12, a film stack has been formed. In an embodiment, this film stack consists of a buried oxide layer 14, an upper (top) SOI silicon layer 16, a pad oxide layer 18, a nitride layer 20, and a second photoresist mask 66. In another embodiment, pad oxide layer 18 is optional. In a specific embodiment, support substrate 12 comprises silicon. The thickness range of buried oxide layer 14 is between 50 nm and 1000 nm. Upper SOI layer 16 has a thickness ranging between 5 nm and 120 nm, and pad oxide layer 18 has a thickness between 5 nm and 25 nm. Nitride layer 20 has a thickness between 50 nm and 200 nm.

In FIG. 9, portion 900 has already undergone a first photoresist masking and etch through a first portion of a semiconductor comprising layer to form a first opening where layers 14, 16, 18, and 20 have been removed. Second photoresist mask 66 and an etch will serve to create second opening locations 61 for a trench isolation region, as well as to define a third opening location 64 for an alignment feature within the existing first opening where layers 14, 16, 18, and 20 were removed in the first photoresist mask and etch step. The step of forming the first opening involves using an anisotropic, dry etch process to form a first portion of the first opening through a semiconductor comprising layer and forming a second portion of the first opening through a dielectric layer underlying the semiconductor comprising layer to expose underlying substrate 12. An exemplary chemistry to form the first opening as illustrated in FIG. 9 can include a first etch step utilizing CF4 to etch through layers 20, 18, and 16, and a second etch step utilizing CHF3/Ar to etch through BOX layer 14 and stop on substrate 12.

Figure 10:
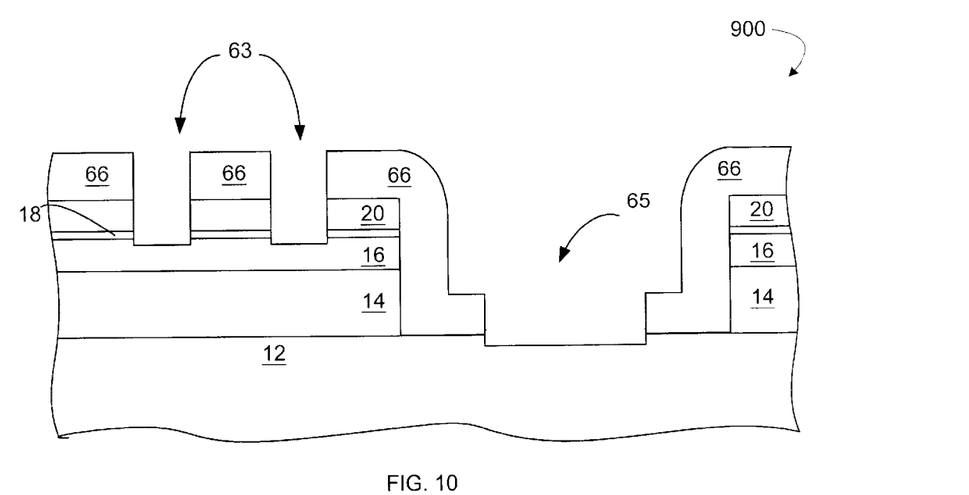
Figure 11:
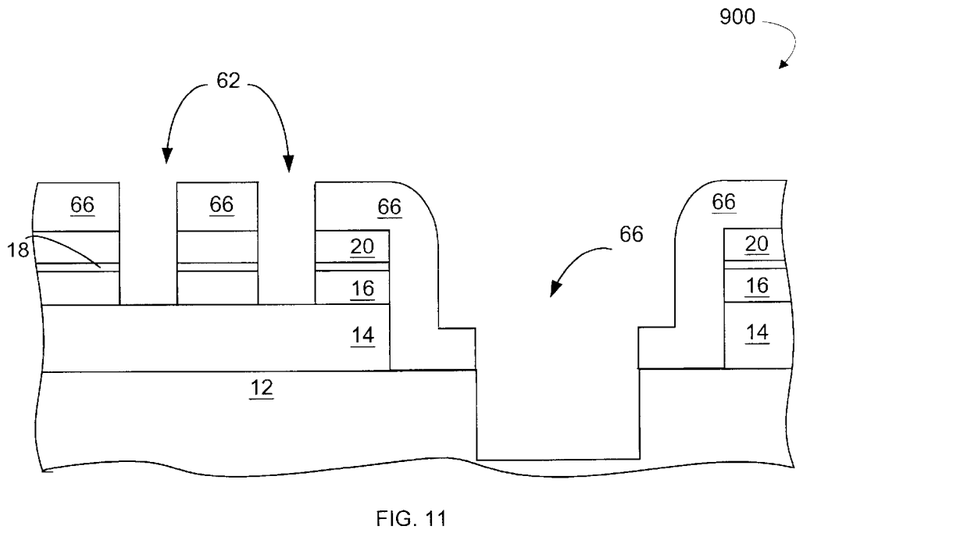

FIG. 10 illustrates portion 900 with reference to FIG. 9, after the second etch process, prior to removal of second photoresist mask 66. Openings 63 and 65 have been formed by etching simultaneously at least partially through the semiconductor comprising layer 16 (stack) to, at least partially, form the trench isolation features, and through the support substrate 12, at least partially, to form the alignment features. An exemplary plasma etch chemistry for the second etch process (dry etch recipe) could use CH2F2 as etchant gas for the nitride 20, as CH2F2 is selective to oxide and silicon. The pad oxide layer 18 could then be etched using CF4 as the main etch gas to form openings 63. Because CF4 provides little selectivity, this step results in at least a partial etch into the support substrate silicon 12, forming opening 65, as seen in FIG. 11. In a specific embodiment, the etching is stopped when the upper silicon SOI layer 16 is reached, as shown in FIG. 10.

In another embodiment, top SOI silicon layer 16 of portion 900 could be etched completely through, as seen in FIG. 11, by using HBr and Cl2 as etchant. This chemistry has a high selectivity to oxide, and therefore does not etch much into BOX layer 14. It should be noted that the etch shown in FIG. 11 may utilize the same etch chemistry for the etch process of FIG. 10, or may utilize a different etch process. The trench isolation feature opening 62 and the alignment feature opening 66 may be formed simultaneously using an HBr/Cl2 etch chemistry process. The etch can proceed even after semiconductor layer 16 has been consumed until opening 66 has been etched to the desired depth. The high selectivity of this HBr/Cl2 etch chemistry to the buried oxide layer prevents significant deepening of openings 62 into the buried oxide layer 14. Process control of the etch process can be accomplished by measuring the step height of the formed trench feature 63 (if etch stopped after the process as illustrated in FIG. 10) and/or alignment mark depth, if etch completed as illustrated in FIG. 11.

Another exemplary plasma chemistry for the second etch process illustrated with reference to FIGS. 10 and 11 could utilize CF4/HBr to etch though layer 20 and layer 18, and partially etch into layer 16 and substrate 12, as seen in FIG. 10. A second etch step, utilizing HBr/Cl2 to etch through layer 16 and deeper into substrate 12, as seen in FIG. 11, would follow. It should be noted that utilization of the CF4/HBr chemistry in the etch process depends upon the thickness of nitride layer 20. If nitride layer 20 is comparable in thickness to the desired depth of openings 66, because CF4/HBr chemistry is non-selective to silicon, the target depth of layer 66 can be obtained before layer 16 is even reached. This is the case when nitride layer 20 is typically 1000 to 1500 Angstroms, and the target depth for layer 66 is about 1200 Angstroms, which is often the case in fabrication. However, if nitride layer 20 is thinner, e.g., 700 Angstroms, and silicon layer 16 is, e.g., 300 Angstroms, the CF4/HBr etch chemistry would produce the desired result.

Figure 12:
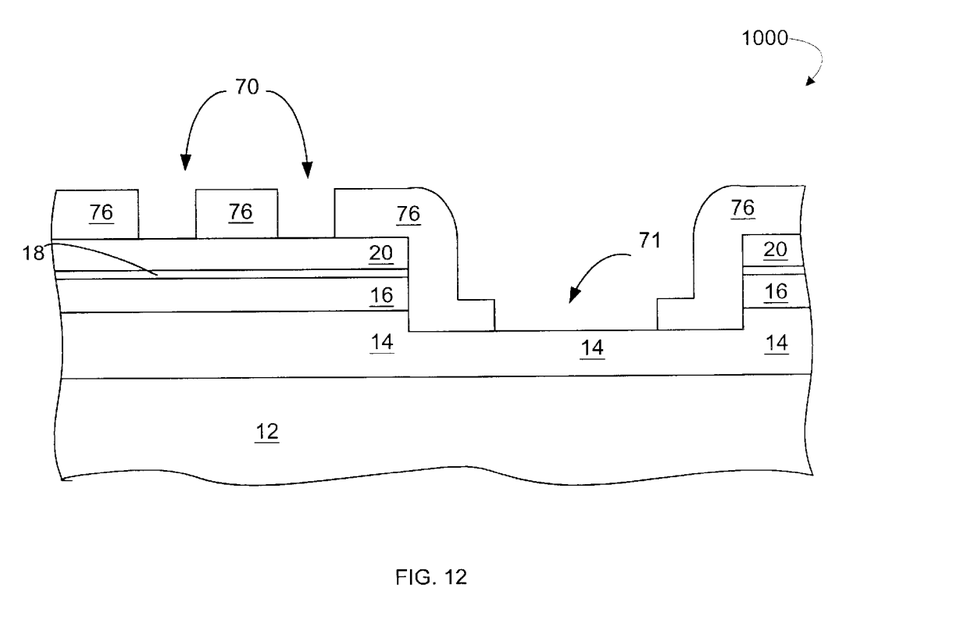
Figure 13:
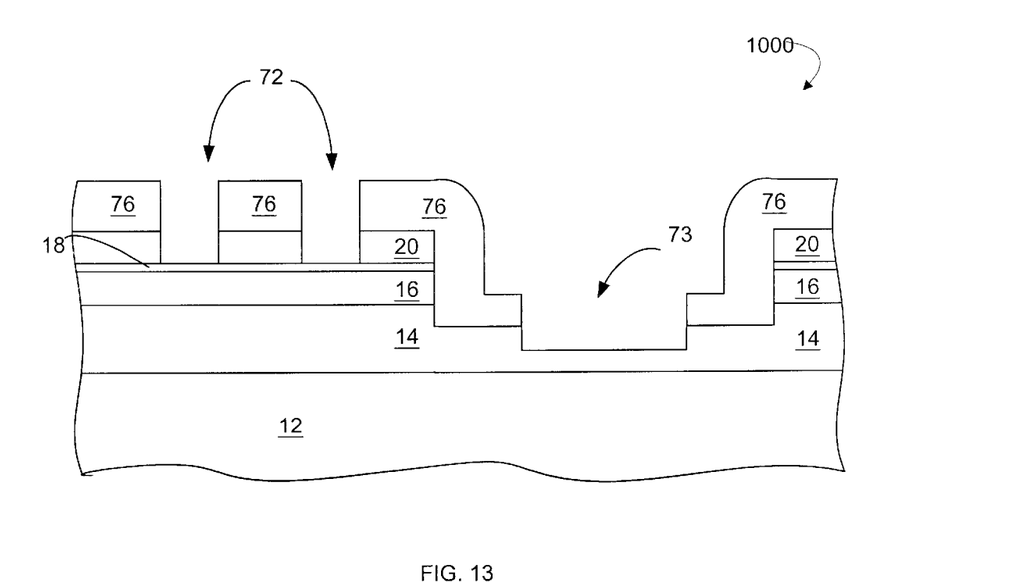
Figure 14:
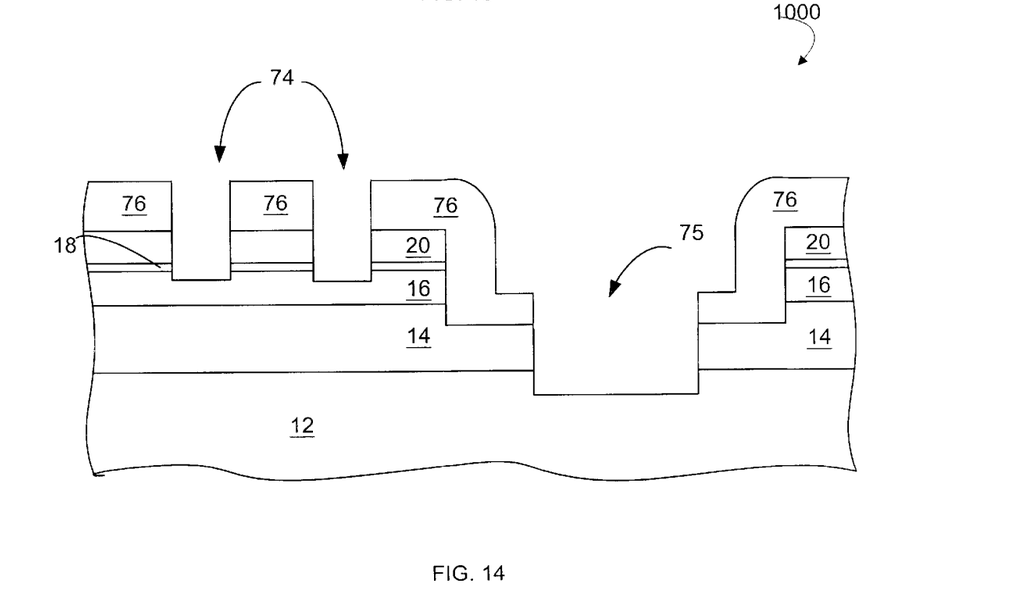
Figure 15:
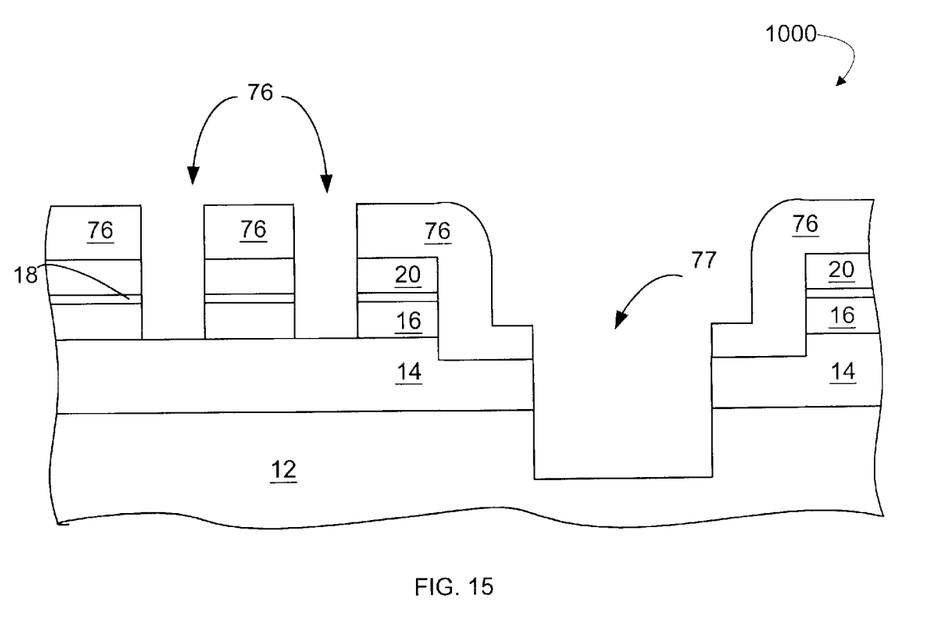

FIG. 12 illustrates a cross-sectional view of a portion 1000 of a semiconductor wafer at a point in the device manufacturing cycle. On support substrate 12, a film stack has been formed. In an embodiment, this film stack consists of a buried oxide (dielectric) layer 14, an upper SOI silicon layer 16, a pad oxide layer 18, a nitride layer 20, and a second photoresist mask 76. In another embodiment, pad oxide layer 18 is optional. In FIG. 12, portion 1000 has already undergone a first photoresist masking and etch to form a first opening location 71. The methodology for forming the first opening comprises forming the first opening through a semiconductor comprising layer and partially through a dielectric layer 14 underlying the semiconductor comprising layer, wherein the dielectric layer 14 has a first thickness under the semiconductor layer, and a second thickness within the first opening. In a specific embodiment, the desired depth of the alignment feature is controlled by the second thickness within the first opening location 71 as described below. Second photoresist mask 76 and an etch will serve to create the trench isolation opening locations 70, as well as to define an alignment feature at opening location 71, as is seen in FIGS. 13 through 15. An exemplary etch chemistry to form the first opening location 71 could utilize CF4 in a first etch step to etch through layers 20, 18, 16, and partially etch into BOX layer 14, as see n in FIG. 12. In an embodiment, the step of forming the isolation trench feature locations 70 and the alignment mark feature at opening location 71 comprises etching a first layer (nitride layer 20) within the second opening with a first etch process that is selective to silicon.

FIG. 13 illustrates portion 1000 with reference to FIG. 12, after the second etch process prior to removal of second photoresist mask 76 according to an embodiment of the present disclosure. Openings 72 and 73 have been formed at locations 70 and 71 by simultaneously etching a first layer (nitride layer 20) at the second opening location 72, and the dielectric layer at the third opening location 73. In an embodiment, this simultaneous etch occurs at approximately the same etch rate of between about 1:1.2 and 1.2:1. In another embodiment, top SOI silicon layer 16 of portion 1000 could be etched completely away, as seen in FIG. 15, by using HBr and Cl2 as etchant. This chemistry has a high selectivity to oxide, and therefore does not etch much into BOX layer 14. Process monitoring of the etch process can be accomplished by measuring the step height of opening location 73 or 75 (FIG. 14).

In a further embodiment, plasma etch chemistry for the second etch process (dry etch recipe) could use CH2F2 as etchant gas for the nitride 20, as CH2F2 is selective to oxide and silicon. The residual BOX layer 14 in the alignment location opening 73 must be sufficiently thin, e.g., less than or equal to the thickness of the pad oxide layer 18. This will insure that the pad oxide layer 18 could then be etched using CF4 as the main etch gas to form openings 74. Because CF4 provides little selectivity (i.e., CF4 is a non-selective etchant chemistry), this step results in at least a partial etch into the support substrate silicon 12, forming opening 75, as seen in FIG. 14. In a specific embodiment, the etching is stopped when the upper silicon SOI layer 16 is reached, as shown in FIG. 14.

In portion 1000 of the embodiment illustrated in FIG. 14, the simultaneous etch is stopped when the pad oxide layer 18 has been removed from trench features opening locations 74, and BOX oxide layer 14 has been etched away to the top surface of supporting substrate 12. As before, it should be noted that the etch shown in FIG. 14 may be the same etch process as that in FIG. 13, or may be a different etch process. For example, a first step using CF4 and CHF3 and Argon could be utilized to simultaneously etch the BOX layer 14, nitride layer 20, and pad oxide layer 18. This etch could be stopped on the top silicon 16 and substrate silicon 12. Process monitoring of the etch process is done by monitoring when pad oxide layer 18 has been consumed, or by monitoring the remaining thickness of the BOX layer 14 (at opening 73) during etching. Alternately, a first step with a CF4/HBr etch chemistry may be used for the nitride layer 20 etch, as this chemistry can etch through the BOX layer 14 in the alignment feature opening 75 and into silicon substrate 12 while nitride layer 20 is being consumed in the trench openings 74. This allows definition of the alignment feature 77 (FIG. 15) to the desired depth without excessive etch when followed by a second etch step for the silicon layer 16 etch. A second etch chemistry using HBr and Cl2 could be employed to etch the alignment feature 75 into the silicon substrate 12 to the desired depth, while removing the top SOI layer 16, and could utilize the remaining BOX pillars as hard-mask.

FIG. 15 illustrates portion 1000 with reference to FIG. 14, with simultaneous etching of opening locations 76 and 77 conducted until at least a portion of nitride layer 20, pad oxide layer 18, and top SOI layer 16 have been consumed in trench feature opening locations 76, as well as consumption of supporting substrate silicon 12 to form an opening at a desired depth. Process monitoring is conducted during etch to determine the removal of at least a portion of the nitride layer 20, pad oxide layer 18, and top SOI layer 16 to form the shallow trench isolation feature, or by monitoring the remaining thickness of the BOX layer 14 and/or the step height of opening location 77 during etching.

Because specific etch chemistries as presented herein have been well characterized for selectivity, in the various embodiments disclosed herein, it is possible to calculate a predetermined thickness for the dielectric e.g., nitride layer 20, the pad oxide layer 18, the top layer of silicon SOI 16, and the buried oxide layer 14 to determine the etch profile(s) to form the shallow trench isolation feature and the alignment feature to a desired depth. For example, a CF4/HBr etch process etches silicon, nitrides, and oxides at practically the same rate (non-selective, or little selectivity), while other etch chemistries such as HBr and Cl2 have a high selectivity to oxides. The term selectivity, to be technically accurate, should be expressed as a ratio, e.g., nitride selectivity= nitride etch rate/oxide etch rate for a nitride etch step.

Typically, however, in general usage when those of the art say 'a nitride etch selective to oxide,' they mean that the nitride would be etched, while the oxide would not be etched.

In an embodiment, a predetermined target value for the BOX layer 14 in the first opening can be calculated, and etch times can be calculated to determine a desired depth, e.g., desired STI feature profile, of an alignment feature. The target value for BOX layer 14 may be determined utilizing the thickness and chemical selectivities of the various layers to be etched, as well as consideration of the various chemistry processes.

For example, if nitride is to be etched with a CHF3/CF4 type chemistry, the selectivity ratio of nitride to buried oxide is usually slightly less than 1, and the amount of buried oxide remaining has to be less than or equal to the nitride thickness+pad oxide thickness. This ensures that buried oxide is cleared before the trenches are etched in the HBr/Cl2 etch. In this case, the etch depth of the alignment feature can be controlled as previously discussed by using an HBr/Cl2 over-etch.

In the embodiments where nitride layer 20 is to be etched using a CF4/HBr chemistry, at least two scenarios exist: 1. Obtaining the least amount of buried oxide required, and, 2. Obtaining the most amount of buried oxide required. Calculating the least amount of buried oxide required (least thickness) with a nitride etched in CF4/HBr would be as follows:

Least amount of BOX thickness remaining in First Opening (Target Value)={(Oxide etch rate/Nitride etch rate (nitride etch))×(Nitride thickness–Nitride etch rate/Si etch rate (nitride etch))×(Target depth–Si thickness–Si etch rate/Pad oxide etch rate (pad oxide etch))×(Pad oxide thickness)}, where target depth is some chosen value, e.g., 120 nm, and the terms nitride etch, and pad oxide etch in parentheses in the equations indicate either a nitride etch process or a pad oxide etch process. In this equation for the first case, the remaining buried oxide is targeted based on the assumption that the CF4/HBr etch etches through the buried oxide and into the Si during nitride etch, and the Si etch does not need much over-etch to hit the target depth in the alignment opening area.

In the second case, calculating the greatest amount of buried oxide required (greatest thickness) with a nitride etched in CF4/HBr would be as follows:

Most amount of BOX thickness remaining in First Opening (Target Value)={[Nitride thickness×(Oxide etch rate/Nitride etch rate (nitride etch))]+Pad oxide thickness}.

This second case equation assumes that the etch into the underlying substrate silicon in the alignment opening region begins when trenches are being etched into the upper SOI silicon, with depth control again utilizing the selectivity of HBr/Cl2 to oxide.

Another chemistry approach could be the use of CH2F2 or similar chemistry very selective to oxide for the nitride layer etch. In this approach, the maximum buried oxide thickness is, as before, given by:

{[Nitride thickness×Oxide etch rate/Nitride etch rate (nitride etch)]+Pad oxide thickness}.

Again, this equation assumes that silicon is exposed in the alignment feature region when the upper SOI silicon starts to etch.

The etch times for the various chemistries disclosed herein can be determined from the etch selectivities for the given materials undergoing etch with a particular etch chemistry, as are well known in the art.

The method and apparatus herein provides for a flexible implementation. Although the invention has been described using certain specific examples, it will be apparent to those skilled in the art that the invention is not limited to these few examples. For example, the disclosure is discussed herein primarily with regard to silicon SOI wafers and shallow trench isolation features and alignment marks, however, the invention can be used with other Semiconductor-on-Insulator materials to create STI features and alignment features that are created by etching processes during device manufacture. Additionally, various types of etch chemistries are currently available which could be suitable for use in employing the method as taught herein. Note also, that although an embodiment of the present invention has been shown and described in detail herein, along with certain variants thereof, many other varied embodiments that incorporate the teachings of the invention may be easily constructed by those skilled in the art. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method comprising:
    forming a first photoresist mask over a substrate to define a first opening location;
    forming the first opening through a semiconductor comprising layer; and
    forming the first opening partially through a dielectric layer underlying the semiconductor comprising layer, wherein the dielectric layer has a first thickness under the semiconductor layer and a second thickness within the first opening:
        forming a second photoresist mask over the substrate to define a second opening location for a trench isolation region and a third opening location for an alignment feature, wherein the third opening location is within the first opening; and
        forming the trench isolation feature and the alignment feature.

2. The method of claim 1, wherein the substrate includes semiconductor-on-insulator (SOI) material.

3. The method of claim 2, wherein the semiconductor material comprises silicon.

4. The method of claim 2, wherein the semiconductor material comprises GaAs.

5. The method of claim 2, wherein the semiconductor material comprises SiGe.

6. The method of claim 1, wherein forming the trench isolation feature and the alignment feature further comprises:
    etching simultaneously at least partially through the semiconductor comprising layer to at least partially form a trench isolation feature opening and through the support substrate to at least partially form an alignment feature opening using an etch process that is selective to the dielectric layer.

7. The method of claim 1, wherein forming the isolation trench feature and the alignment feature further comprises:
    etching a first layer at the second opening location and the dielectric layer at the third opening location simultaneously at approximately the same etch rate, wherein the first layer is formed immediately adjacent the photoresist mask and the approximately same etch rate is between 1:1.2 and 1.2:1.

8. The method of claim 7, wherein the first layer comprises a nitride layer.

9. The method of claim 1, wherein forming the trench isolation feature and the alignment feature further comprises:

forming a trench isolation feature opening and an alignment feature opening simultaneously during an etch process that is controlled by monitoring when the semiconductor layer at the second location has been consumed.

10. The method of claim 9, wherein the depth of the alignment feature is controlled by the second thickness.

11. The method of claim 1, wherein forming the trench isolation feature and the alignment feature further comprises:

etching a first layer within the second opening with a first etch process that is selective to silicon.

12. The method of claim 11, wherein forming the trench isolation feature and the alignment feature further comprises:

forming a trench isolation feature opening and an alignment feature opening simultaneously during a second etch process that is controlled by monitoring when the semiconductor layer at the second location has been consumed.

13. The method of claim 11, wherein forming the isolation trench feature and the alignment feature further comprises:

etching a first layer at the second opening and the dielectric layer at the third opening simultaneously at approximately the same etch rate, wherein the first layer is formed immediately adjacent the photoresist mask and the approximately same etch rate is between 1:1.2 and 1.2:1.

14. The method of claim 13, further comprising the steps of:

calculating a predetermined target value for the buried oxide layer in the first opening; and calculating etch times to form a desired trench isolation feature profile and the alignment feature to a desired depth.

* * * * *